United States Patent
D'Abrigeon et al.

(10) Patent No.: US 10,644,183 B2
(45) Date of Patent: May 5, 2020

(54) SOLAR CELL ASSEMBLY

(71) Applicant: THALES, Courbevoie (FR)

(72) Inventors: Laurent D'Abrigeon, Callian (FR); Frédéric Maloron, Golfe Juan (FR); Jean-Noël Voirin, La Roquette sur Siagne (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/899,325

(22) Filed: Feb. 19, 2018

(65) Prior Publication Data
US 2018/0254367 A1 Sep. 6, 2018

(30) Foreign Application Priority Data
Mar. 2, 2017 (FR) ..................... 17 00206

(51) Int. Cl.
| | | |
|---|---|---|
| H01L 31/05 | (2014.01) | |
| H01L 31/048 | (2014.01) | |
| H01L 31/054 | (2014.01) | |
| H01L 31/042 | (2014.01) | |
| B64G 1/44 | (2006.01) | |
| H01L 31/02 | (2006.01) | |
| H01L 31/0352 | (2006.01) | |

(52) U.S. Cl.
CPC .......... *H01L 31/0508* (2013.01); *B64G 1/443* (2013.01); *H01L 31/02008* (2013.01); *H01L 31/035281* (2013.01); *H01L 31/042* (2013.01); *H01L 31/048* (2013.01); *H01L 31/054* (2014.12); *H01L 31/0547* (2014.12); *Y02E 10/52* (2013.01)

(58) Field of Classification Search
CPC .......... H01L 31/035281; H01L 31/054; H01L 31/042; H01L 31/048; H01L 31/0508; H01L 31/0352
See application file for complete search history.

(56) References Cited

U.S. PATENT DOCUMENTS 3,532,551 A * 10/1970 Scott ..................... H01L 31/052
136/246
4,313,023 A * 1/1982 Stephens ............... H01L 31/048
136/246
(Continued)

FOREIGN PATENT DOCUMENTS

FR 2 864 347 A1 6/2005
JP 3349318 B2 * 11/2002 ..... H01L 31/035281
(Continued)

OTHER PUBLICATIONS

English machine translation of JP 3349318 B2 provided via the EPO. 2019. All Pages. (Year: 2019).*
(Continued)

*Primary Examiner* — Daniel P Malley, Jr.
(74) *Attorney, Agent, or Firm* — Baker & Hostetler LLP

(57) ABSTRACT

A solar cell assembly comprises a first assembly of at least one photovoltaic cell and a protective glass positioned on the active face of the first assembly, the area of the protective glass covering more than the entirety of the active face of the first assembly, and comprises a second assembly of at least one portion of the protective glass extending from the active face of the first assembly, the second assembly comprises an optically reflective surface.

4 Claims, 2 Drawing Sheets

(56) References Cited

U.S. PATENT DOCUMENTS

| | | | |
|---|---|---|---|
| 6,091,020 A * | 7/2000 | Fairbanks | G02B 3/0056 |
| | | | 136/259 |
| 2010/0132793 A1 | 6/2010 | Nakamua et al. | |
| 2016/0172520 A1 | 6/2016 | Nakamura | |

FOREIGN PATENT DOCUMENTS

| | | | |
|---|---|---|---|
| JP | 2010021350 A | * | 1/2010 |
| WO | 2009/109084 A1 | | 9/2009 |

OTHER PUBLICATIONS

English machine translation of Asano (JP-2010021350-A) provided by the EPO. (Year: 2019).*
English machine translation of Asano et al. (JP 2010/021350 A) provided by the EPO. (Year: 2019).*
Helios Technology, "Solar kits M12 and M20, H12 series photovoltaic module, H200 series photovoltaic module," May 1, 1999, XP055427943.

* cited by examiner

SOLAR CELL ASSEMBLY

CROSS-REFERENCE TO RELATED APPLICATIONS

This application claims priority to foreign French patent application No. FR 1700206, filed on Mar. 2, 2017, the disclosure of which is incorporated by reference in its entirety.

FIELD OF THE INVENTION

The present invention pertains to a solar cell assembly, in particular for a solar generator.

BACKGROUND

A solar cell assembly, also referred to as a fitted solar cell, is an electronic component that, when exposed to light (photons), produces electricity by virtue of the photovoltaic effect.

The electrical power obtained is proportional to the radiant power that is incident on the solar cell assembly and on the area of the solar cell assembly.

Photovoltaic cells are produced on a substrate or wafer, i.e. a crystal structure that is originally circular but then cut to the desired geometry, this structure also being referred to as a raw cell.

The photovoltaic cells are then fitted with interconnectors, covered with a cover glass, and fitted with a bypass diode, which is placed beside the photovoltaic cell in most technologies, to form a solar cell assembly.

A photovoltaic network is an assembly or layout of photovoltaic cells that are laid out side-by-side.

The energy efficiency of the photovoltaic effect decreases with increasing temperature, hence it is advantageous to keep a photovoltaic network as cold as possible to improve its efficiency.

FIG. 1 is a schematic illustration of one non-limiting example of a photovoltaic cell 1 in the shape of a semicircle, in which a protective glass 2 is cut to the same shape as the photovoltaic cell 1 and arranged on the photovoltaic cell 1 to form a fitted photovoltaic cell 3.

In the case of solar generators for space applications and for missions close to the sun, the problem of rising temperature and decreasing efficiency is solved by placing optical solar reflectors (OSRs, or mirrors) between the cells, as for example illustrated in FIG. 2, where rows 4 of fitted photovoltaic cells 3 akin to those of FIG. 1, but in this example semihexagonal in shape, and rows 5 of mirrors or OSRs are alternated.

The problem with such a solution is the decrease in active area and also the need to add components (OSRs or mirrors) to the network to lower the temperature. This is complex and expensive, and hence generally not applied to solar generators for missions in Earth orbits for which an additional cost such as this is too high with respect to the more limited heating of the photovoltaic cells with respect to a hot mission closer to the sun.

SUMMARY OF THE INVENTION

One aim of the invention is to improve the efficiency of solar cells by limiting the rise in temperature of photovoltaic cells, and to achieve this at low cost.

Therefore, according to one aspect of the invention, a solar cell assembly is provided, comprising a first assembly of at least one photovoltaic cell and a protective glass positioned on the active face of the first assembly, the area of the protective glass covering more than the entirety of the active face of the first assembly, and comprising a second assembly of at least one portion of the protective glass extending from the active face of the first assembly, the second assembly comprising an optically reflective surface.

Such a fitted photovoltaic cell makes it possible to obtain an absorptivity/emissivity ratio ($\alpha/\varepsilon$) on the second assembly that is lower than that of the rest of the solar cell assembly or first assembly of at least one photovoltaic cell. Thus, according to the invention the mean absorptivity/emissivity ratio of the fitted photovoltaic cell is decreased and due to in-plane thermal conduction, the active portion of the cell is cooled and efficiency is increased.

Additionally the cost is highly constrained, since there is no addition of components lowering the packing factor of the solar panels and thereby substantially increasing their mass and bulk. The present invention significantly increases the efficiency of the network without substantially increasing the mass, and it achieves this at low cost.

In one embodiment, the entire second assembly comprises an optically reflective surface.

Thus, the space available for reflecting light is optimized and the heating of the photovoltaic cells is limited.

According to one embodiment, the one or more photovoltaic cells are semicircular in shape.

As a variant, the one or more photovoltaic cells are semihexagonal in shape.

The latest photovoltaic cells have bevelled corners and are substantially semihexagonal in shape.

In one embodiment, the protective glass is rectangular.

A rectangular shape is simple and inexpensive to produce and facilitates the positioning of the fitted cells, while decreasing the cost of placing them during fitting.

According to one embodiment, the first assembly comprises a single photovoltaic cell.

Thus, even with only one cell, the reflective portion has an absorptivity/emissivity ratio that is lower than the active portion and lower than the network of the solar cell assembly, thereby decreasing, by in-plane conduction, the temperature of the active portion of the photovoltaic cell and leading to increased efficiency.

In one embodiment:
the first assembly comprises a single photovoltaic cell;
the photovoltaic cell is semicircular or semihexagonal in shape;
the protective glass is rectangular; and
the length of the rectangular protective glass is that of the base of the semicircle or of the semihexagon.

Thus, the missing corner is replaced by a reflective surface that allows the temperature to be lowered and efficiency to be increased without negatively affecting the packing factor.

According to one embodiment, the outline of the photovoltaic cell fits inside the rectangular outline of the protective glass.

Thus, whatever the geometry of the cell (which allows it to be optimized in terms of manufacturing cost), simplifying it to the circumscribed rectangle by using the missing space to replace it with a reflective surface allows the temperature to be lowered and efficiency to be increased without negatively affecting the packing factor.

In one embodiment, said reflective surface comprises a silvering arranged on the face of the second assembly that makes contact with the active face of the first assembly.

This is a well-known means for producing an optically reflective surface or mirror at low cost.

According to another aspect of the invention, a solar generator is also provided, comprising at least one fitted photovoltaic cell such as described above.

BRIEF DESCRIPTION OF THE DRAWINGS

The invention will be better understood on studying a few embodiments described by way of completely non-limiting examples and illustrated by the appended drawings, in which.

DETAILED DESCRIPTION

In the various figures, the elements that have the same references are identical.

Figure 1:
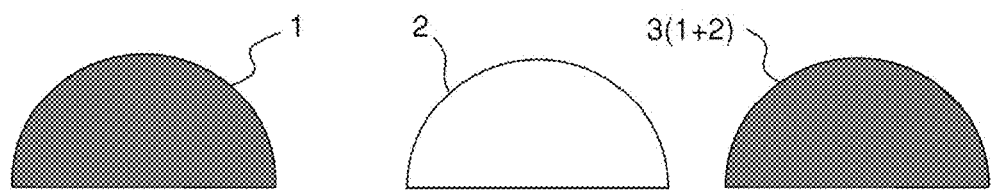
FIG. 1 schematically illustrates a photovoltaic cell and its fitting with a protective glass having the same geometry, according to the prior art.
Figure 2:
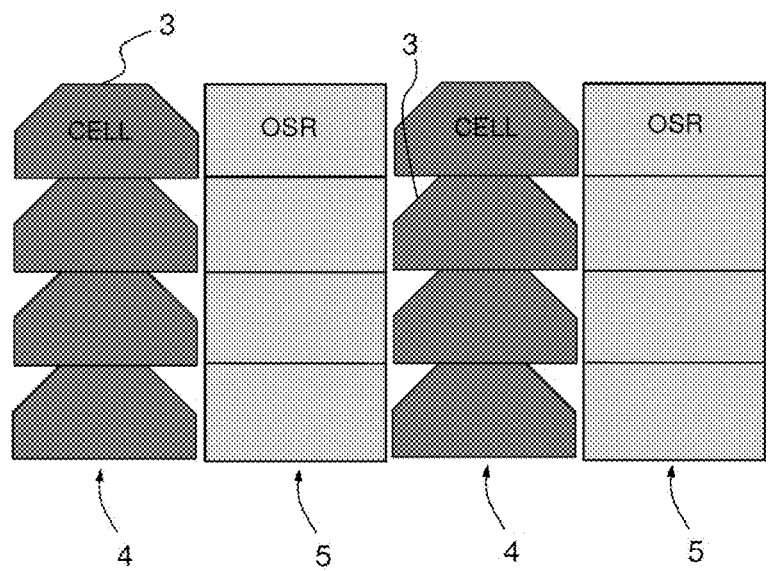
FIG. 2 schematically illustrates an arrangement of fitted photovoltaic cells with mirrors, according to the prior art.
Figure 3:
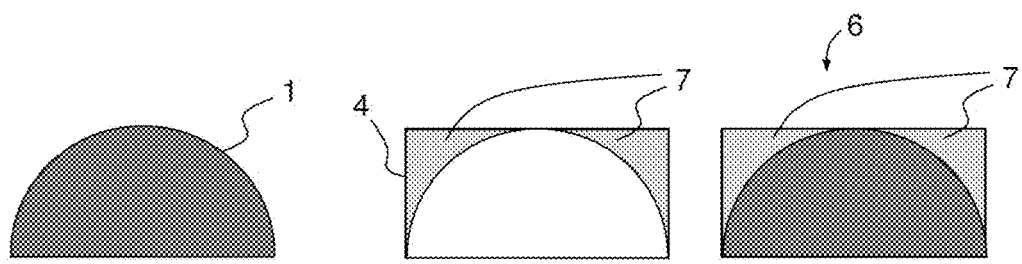
FIG. 3 schematically illustrates a fitted photovoltaic cell according to one aspect of the invention with a photovoltaic cell in the shape of a semicircle.

FIG. 3 shows, nonlimitingly, a photovoltaic cell 1, for example in the shape of a semicircle, on which a rectangular protective glass 1 is positioned. In this instance, the resulting fitted photovoltaic cell 6 comprises only one photovoltaic cell 1 but, as a variant, it may contain others.

In the case shown, the length of the rectangular protective glass is that of the base of the semicircle. As a variant, the length of the rectangular protective glass may be greater than that of the base of the semicircle, or equal to that of the base of the semihexagon in the case of a semihexagon-shaped cell, or greater than or equal to the base of a cell with truncated edges.

Furthermore, in the case shown, the outline of the photovoltaic cell fits inside the rectangular outline of the protective glass.

Thus, the compactness of the arrangement of the fitted photovoltaic cells on a solar generator panel is optimized.

The portions 7 of the protective glass 4 not covering the active face of the photovoltaic cell 1 comprise an optically reflective surface such as a mirror.

For example, the portions 7 are silvered, or, stated otherwise, comprise a silvering, forming an optically reflective surface or mirror.

Figure 4:
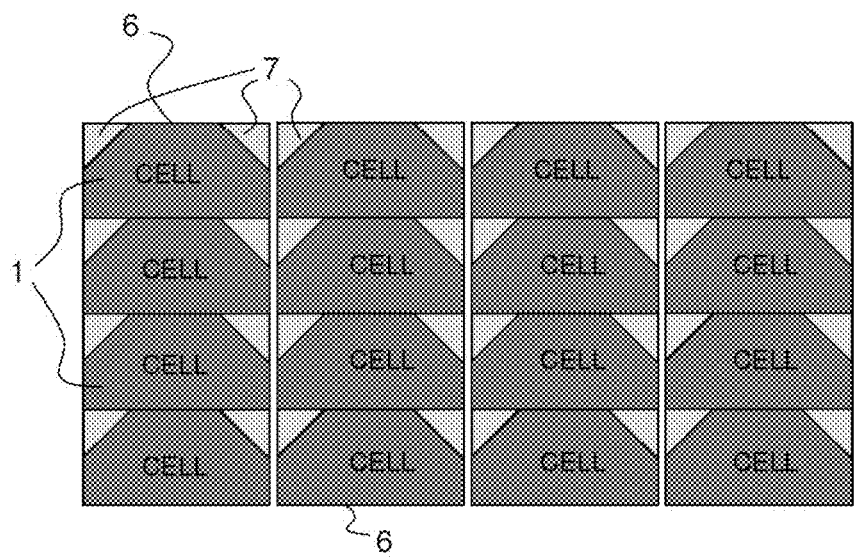
FIG. 4 schematically illustrates an arrangement of fitted photovoltaic cells with semihexagon-shaped cells for a solar generator according to one aspect of the invention.

FIG. 4 schematically shows an arrangement for a solar generator, provided with fitted photovoltaic cells 6 provided with photovoltaic cells 1, akin to those in FIG. 3, but in this example the photovoltaic cells 1 are semihexagonal in shape.

Figure 5:
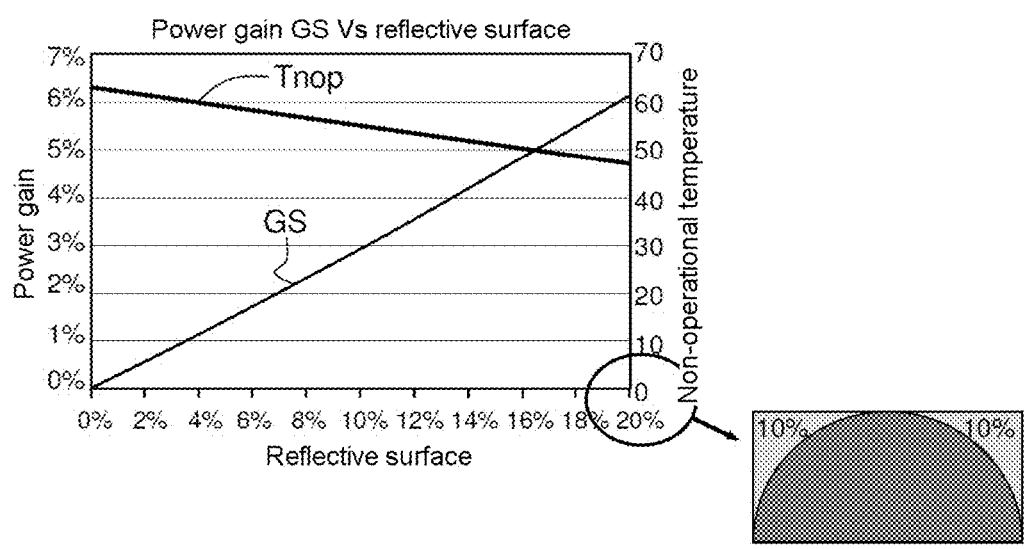
FIG. 5 schematically illustrates the power gain of a photovoltaic array (curve GS) and the decrease in non-operational temperature (curve Tnop) according to the percentage of optically reflective surface, according to one aspect of the invention, the efficiency curve is an example based on the properties of triple-junction GaAs arrays in the case of a space application with solely radiative exchanges.

FIG. 5 schematically illustrates the power gain GS of a fitted photovoltaic cell 6 according to FIG. 3, as a function of the optically reflective surface 7.

In this case, when the fitted photovoltaic cell 6 in FIG. 3 is such that the percentage of optically reflective surface of the rectangular protective glass is 20%, the power gain is 6%.

The cost of the protective glass is negligible with respect to the cost of the array and the extra cost of the metallization is largely covered by the substantial gain (up to 6% in power).

FIG. 5 also illustrates the decrease in the non-operational temperature $T_{nop}$ according to the percentage of optically reflective surface, the non-operational temperature $T_{nop}$ representing the temperature when the array is not active. When the array is in use, the operational temperature $T_{op}$ is lower than the non-operational $T_{nop}$ temperature due to the energy budget of the photovoltaic cell for which electrical power is drawn (outgoing power). The operational temperature $T_{op}$ decreases proportionally to the non-operational temperature $T_{nop}$ and therefore guarantees increased operating efficiency.

The invention claimed is:

1. A solar cell assembly comprising a first assembly of only one photovoltaic cell semicircular in shape and a rectangular protective glass having a length that is equal to that of the base of the semicircle and being positioned on the active face of the first assembly, the protective glass being larger than the active face of the first assembly and covering the entirety of the active face of the first assembly, the outline of the photovoltaic cell fitting inside the rectangular outline of the protective glass, and comprising a second assembly of at least one portion of the protective glass extending from the active face of the first assembly, the second assembly comprising an optically reflective surface that makes contact with the active face of the first assembly wherein the second assembly covers 20% of the protective glass.

2. The solar cell assembly according to claim 1, wherein the entire second assembly comprises an optically reflective surface.

3. The solar cell assembly according to claim 1, wherein said reflective surface comprises a silvering arranged on the face of the second assembly.

4. The solar generator comprising at least one fitted photovoltaic cell according to claim 1.

* * * * *